US 9,238,865 B2

(12) United States Patent
Pomarede et al.

(10) Patent No.: US 9,238,865 B2
(45) Date of Patent: Jan. 19, 2016

(54) MULTIPLE VAPOR SOURCES FOR VAPOR DEPOSITION

(75) Inventors: Christophe Pomarede, Vaterstetten (DE); Eric Shero, Phoenix, AZ (US); Mohith Verghese, Phoenix, AZ (US); Jan Willem Maes, Leuven (BG); Chang-Gong Wang, Chandler, AZ (US)

(73) Assignee: ASM IP HOLDING B.V., Almere (NL)

( * ) Notice: Subject to any disclaimer, the term of this patent is extended or adjusted under 35 U.S.C. 154(b) by 45 days.

(21) Appl. No.: 13/367,010

(22) Filed: Feb. 6, 2012

(65) Prior Publication Data

US 2013/0203267 A1 Aug. 8, 2013

(51) Int. Cl.
*C23C 14/24* (2006.01)
*C23C 16/04* (2006.01)
(Continued)

(52) U.S. Cl.
CPC .............. *C23C 16/045* (2013.01); *C23C 16/448* (2013.01); *C23C 16/4482* (2013.01); *C23C 16/45527* (2013.01); *C23C 16/45561* (2013.01);
(Continued)

(58) Field of Classification Search
CPC .............. C23C 16/045; C23C 16/4482; C23C 16/45527; C23C 14/24–14/26; C23C 14/54; C23C 16/06–16/08; C23C 16/448–16/452; C23C 16/45502–16/4551; C23C 16/45523–16/45555; C23C 16/45557; C23C 16/52; H01L 21/02148; H01L 21/02181; H01L 21/0228; H01L 21/02312–21/02315; H01L 21/28194; H01L 21/3141–21/3142; F17C 13/04–13/045; F17C 2205/013–2205/0146; F17C 2205/0352–2205/0367; F17C 2227/047; F17C 2270/0518; F17C 7/00–7/04; F17C 9/00–9/04; F17C 21/02312–21/02315; F17C 21/28194; F17C 21/3141–21/3142; H01J 37/3244–37/32449
USPC ................ 117/84, 89, 93, 200; 118/715, 726; 156/345.1, 345.24, 345.29, 345.33
See application file for complete search history.

(56) References Cited

U.S. PATENT DOCUMENTS 4,511,593 A 4/1985 Brandolf
5,122,252 A 6/1992 Latz et al.
(Continued)

FOREIGN PATENT DOCUMENTS

DE WO 2009147156 A1 * 12/2009 ............... B05D 1/60
WO WO 2004010469 A2 * 1/2004

OTHER PUBLICATIONS

"Aerosol, n.". OED Online. Jun. 2015. Oxford University Press. http://www.oed.com/view/Entry/3203?result=1&rskey=FJvv7R& (accessed Jul. 12, 2015).*

(Continued)

*Primary Examiner* — Jeffrie R Lund
*Assistant Examiner* — Stanislav Antolin
(74) *Attorney, Agent, or Firm* — Knobbe Martens Olson & Bear LLP

(57) ABSTRACT

A vapor deposition method and apparatus including at least two vessels containing a same first source chemical. A controller is programmed to simultaneously pulse to the reaction space doses or pulses of a gas from the vessels, each of the doses having a substantially consistent concentration of the first source chemical. The apparatus may also include at least two vessels containing a same second source chemical. The controller can be programmed to simultaneously pulse to the reaction space doses or pulses of a gas from the vessels containing the second source chemical, each of the doses having a substantially consistent concentration of the second source chemical. The second source chemical can be pulsed to the reaction space after the reaction space is purged of an excess of the first source chemical.

9 Claims, 6 Drawing Sheets

(51) Int. Cl.
- *C23C 16/448* (2006.01)
- *C23C 16/455* (2006.01)
- *C23C 16/52* (2006.01)
- *H01J 37/32* (2006.01)
- *H01L 21/02* (2006.01)
- *H01L 21/314* (2006.01)
- *H01L 21/316* (2006.01)
- *H01L 21/28* (2006.01)

(52) U.S. Cl.
CPC ............ *C23C 16/52* (2013.01); *H01J 37/32449* (2013.01); *H01L 21/0228* (2013.01); *H01L 21/02148* (2013.01); *H01L 21/02181* (2013.01); *H01L 21/3142* (2013.01); *H01L 21/31645* (2013.01); *C23C 14/246* (2013.01); *C23C 16/4485* (2013.01); *C23C 16/4486* (2013.01); *F17C 2205/0142* (2013.01); *F17C 2205/0146* (2013.01); *F17C 2270/0518* (2013.01); *H01L 21/28194* (2013.01)

(56) References Cited

U.S. PATENT DOCUMENTS

| | | | | |
|---|---|---|---|---|
| 5,279,338 | A * | 1/1994 | Goossens | B67D 7/0272 141/198 |
| 5,336,533 | A | 8/1994 | Balmashnov | |
| 5,366,555 | A | 11/1994 | Kelly | |
| 5,551,309 | A * | 9/1996 | Goossens | B67D 7/0272 137/113 |
| 5,620,524 | A * | 4/1997 | Fan | B01J 4/00 118/715 |
| 5,702,532 | A * | 12/1997 | Wen et al. | 118/730 |
| 5,803,938 | A * | 9/1998 | Yamaguchi et al. | 261/130 |
| 5,981,049 | A | 11/1999 | Ohara et al. | |
| 6,199,599 | B1 * | 3/2001 | Gregg | B01J 4/00 137/209 |
| 6,261,374 | B1 * | 7/2001 | Bang et al. | 118/715 |
| 6,280,844 | B1 | 8/2001 | Vesnovsky et al. | |
| 6,287,965 | B1 * | 9/2001 | Kang et al. | 438/648 |
| 6,296,026 | B1 * | 10/2001 | Gregg | B01J 4/00 137/209 |
| 6,342,277 | B1 * | 1/2002 | Sherman | 427/562 |
| 6,419,462 | B1 * | 7/2002 | Horie et al. | 417/394 |
| 6,457,494 | B1 * | 10/2002 | Gregg | B01J 4/00 137/209 |
| 6,576,063 | B2 | 6/2003 | Toyoda et al. | |
| 6,604,555 | B2 * | 8/2003 | Blatt | F17C 5/00 137/209 |
| 6,780,704 | B1 | 8/2004 | Raaijmakers et al. | |
| 6,815,043 | B2 | 11/2004 | Fleming et al. | |
| 6,881,263 | B2 | 4/2005 | Lindfors et al. | |
| 6,889,524 | B2 * | 5/2005 | O'Connor | F17C 9/02 62/50.2 |
| 6,921,062 | B2 * | 7/2005 | Gregg et al. | 261/23.1 |
| 6,953,047 | B2 * | 10/2005 | Birtcher | B67D 7/0272 134/1.2 |
| 7,022,336 | B2 * | 4/2006 | Papahadjopoulos et al. | 424/450 |
| 7,122,085 | B2 | 10/2006 | Shero et al. | |
| 7,156,380 | B2 | 1/2007 | Soininen | |
| 7,192,486 | B2 * | 3/2007 | Bang et al. | 118/715 |
| 7,334,595 | B2 * | 2/2008 | Birtcher | B67D 7/0272 134/1.3 |
| 7,334,708 | B2 * | 2/2008 | Xu | B08B 9/032 222/135 |
| 7,462,603 | B2 * | 12/2008 | Papahadjopoulos et al. | 514/44 R |
| 7,575,012 | B2 * | 8/2009 | Miki | F17C 5/007 137/1 |
| 7,775,236 | B2 * | 8/2010 | Gold | H01J 37/3244 137/487.5 |
| 7,846,497 | B2 * | 12/2010 | Gold | C23C 16/4412 137/1 |
| 7,959,994 | B2 * | 6/2011 | Spohn et al. | 428/34.1 |
| 8,074,677 | B2 * | 12/2011 | Gold | H01J 37/3244 137/487.5 |
| 8,114,479 | B2 * | 2/2012 | Spohn et al. | 427/255.28 |
| 8,468,840 | B2 * | 6/2013 | Burgers | F17C 5/06 137/572 |
| 8,584,965 | B2 * | 11/2013 | Guillon et al. | 239/8 |
| 2002/0001612 | A1 * | 1/2002 | Papahadjopoulos et al. | 424/450 |
| 2002/0182249 | A1 * | 12/2002 | Papahadjopoulos et al. | 424/450 |
| 2003/0003143 | A1 * | 1/2003 | Papahadjopoulos et al. | 424/450 |
| 2003/0012709 | A1 * | 1/2003 | Xu | B08B 9/032 222/190 |
| 2003/0072975 | A1 * | 4/2003 | Shero et al. | 428/704 |
| 2003/0075273 | A1 * | 4/2003 | Kilpela et al. | 156/345.33 |
| 2003/0111007 | A1 * | 6/2003 | Takamatsu et al. | 117/86 |
| 2003/0145789 | A1 * | 8/2003 | Bauch et al. | 118/715 |
| 2004/0023456 | A1 | 2/2004 | Lee et al. | |
| 2004/0062862 | A1 * | 4/2004 | Ahn | C23C 14/12 427/248.1 |
| 2004/0094092 | A1 * | 5/2004 | Derderian et al. | 118/715 |
| 2004/0163590 | A1 * | 8/2004 | Tran | C23C 16/44 118/715 |
| 2004/0209366 | A1 * | 10/2004 | Papahadjopoulos et al. | 435/458 |
| 2005/0016956 | A1 * | 1/2005 | Liu et al. | 216/67 |
| 2005/0070126 | A1 * | 3/2005 | Senzaki | 438/785 |
| 2005/0072357 | A1 * | 4/2005 | Shero et al. | 118/715 |
| 2005/0170509 | A1 * | 8/2005 | Papahadjopoulos et al. | 435/458 |
| 2005/0229970 | A1 * | 10/2005 | Birtcher | B67D 7/0272 137/240 |
| 2005/0287299 | A1 * | 12/2005 | Ahn | C23C 14/12 427/248.1 |
| 2006/0033678 | A1 | 2/2006 | Lubormirsky et al. | |
| 2006/0099340 | A1 * | 5/2006 | Behle et al. | 427/248.1 |
| 2006/0130896 | A1 * | 6/2006 | Skibinski | F17C 7/00 137/7 |
| 2006/0133955 | A1 * | 6/2006 | Peters | 422/63 |
| 2006/0147513 | A1 * | 7/2006 | Papahadjopoulos et al. | 424/450 |
| 2006/0156980 | A1 * | 7/2006 | Won et al. | 118/715 |
| 2006/0246177 | A1 * | 11/2006 | Miki | F17C 5/007 426/24 |
| 2007/0042119 | A1 * | 2/2007 | Matthysse et al. | 118/715 |
| 2008/0178809 | A1 * | 7/2008 | Spohn et al. | 118/726 |
| 2008/0179767 | A1 * | 7/2008 | Spohn et al. | 261/135 |
| 2008/0182010 | A1 * | 7/2008 | Spohn et al. | 427/96.8 |
| 2008/0182023 | A1 * | 7/2008 | Spohn et al. | 427/255.28 |
| 2008/0182425 | A1 * | 7/2008 | Spohn et al. | 438/758 |
| 2008/0202588 | A1 * | 8/2008 | Gold | C23C 16/4412 137/2 |
| 2008/0202609 | A1 * | 8/2008 | Gold | H01J 37/3244 137/597 |
| 2008/0202610 | A1 * | 8/2008 | Gold | H01J 37/3244 137/597 |
| 2008/0213476 | A1 * | 9/2008 | Spohn et al. | 427/255.23 |
| 2009/0061648 | A1 * | 3/2009 | Horii et al. | 438/778 |
| 2009/0065351 | A1 * | 3/2009 | Nuss | C23C 14/3492 204/192.15 |
| 2009/0078791 | A1 * | 3/2009 | Guillon et al. | 239/398 |
| 2009/0107089 | A1 * | 4/2009 | Chung | F17C 1/00 55/385.1 |
| 2009/0211525 | A1 * | 8/2009 | Sarigiannis et al. | 118/707 |
| 2009/0214777 | A1 * | 8/2009 | Sarigiannis et al. | 427/248.1 |
| 2009/0214778 | A1 * | 8/2009 | Sarigiannis et al. | 427/248.1 |
| 2009/0214779 | A1 * | 8/2009 | Sarigiannis et al. | 427/248.1 |
| 2009/0266296 | A1 * | 10/2009 | Tachibana et al. | 118/663 |
| 2009/0283029 | A1 * | 11/2009 | Arena et al. | 117/108 |
| 2010/0018249 | A1 * | 1/2010 | Burgers | F17C 5/06 62/657 |
| 2010/0255198 | A1 * | 10/2010 | Cleary et al. | 427/255.39 |
| 2010/0266765 | A1 * | 10/2010 | White et al. | 427/248.1 |
| 2011/0143034 | A1 * | 6/2011 | Ahn et al. | 427/249.6 |
| 2011/0293832 | A1 * | 12/2011 | Gersdorff | B05D 1/60 427/255.28 |

OTHER PUBLICATIONS

E. Erben et. al. (Infineon), ALD conference 2004, Helsinki, Finland.

X. Liu et.al. (Genus), "ALD of Hafnium Oxide Thin Films from Tetrakis Hafnium and Ozone" JECS 152 (2005) G213.

(56) References Cited

OTHER PUBLICATIONS

Schroeder et. al. (Infineon), Recent Developments in ALD Technology for 50nm Trench DRAM Applications) ECS conference, Los Angeles, Oct. 2005.

Schroeder et. al. (Infineon), "Recent Developments in Ald Technology for 50nm Trench DRAM Applications," ECS Transactions, 1 (5), pp. 125-132 (2006) 10.1149/1.2209261.

T. Suntola, e.g., in the Handbook of Crystal Growth 3, Thin Films and Epitaxy, Part B: Growth mechanisms and Dynamics, Chapter 14, Atomic Layer Epitaxy, pp. 601-663, Elsevier Science B.V. 1994.

Verghese et al. (ASM America), "Solid Source Design Impact on Atomic Layer Deposition", ECS conference, Los Angeles, Oct. 19, 2005.

* cited by examiner

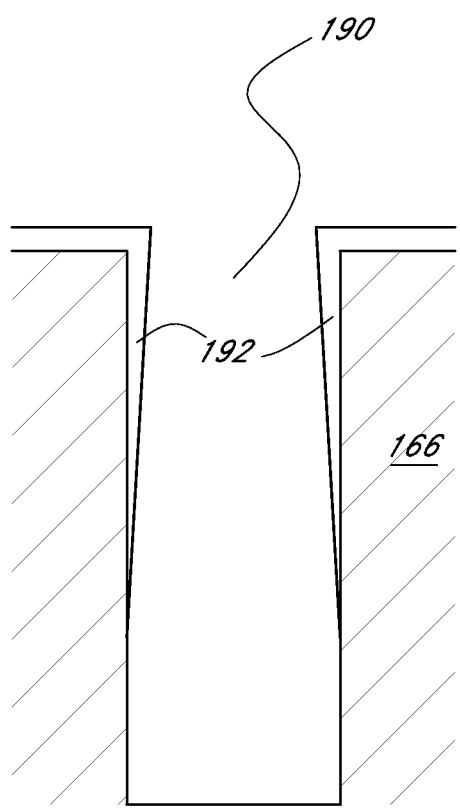
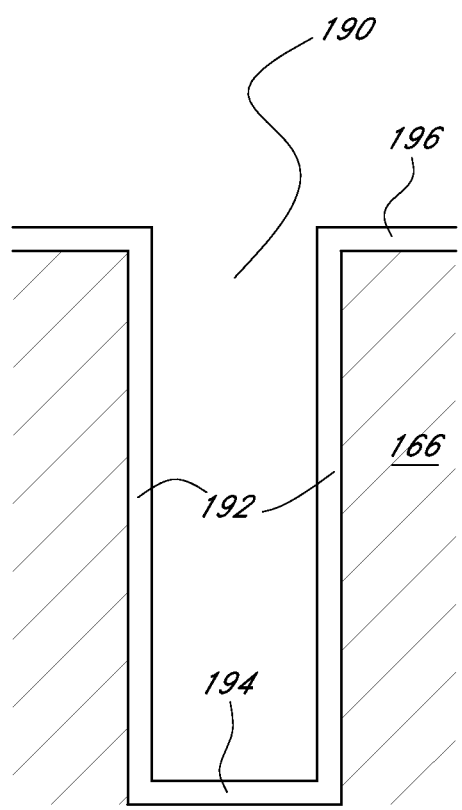
FIG. 1       FIG. 2

MULTIPLE VAPOR SOURCES FOR VAPOR DEPOSITION

BACKGROUND

1. Field

The present application relates generally to substrate fabrication and more particularly, to a method and apparatus for using multiple source chemical vessels to deliver the same source chemical in a vapor deposition process.

2. Description of the Related Art

In the fabrication of integrated circuits on substrates, such as semiconductor wafers, the vapor deposition of chemicals, such as chemical vapor deposition ("CVD") and atomic layer deposition ("ALD"), is often desirable. The expansion of suitable source chemicals has increasingly led to the use of precursor materials that are naturally liquid or solid at room temperature and atmospheric pressures.

Typically, an ALD process employs alternating surface reactions whereby a substrate on which deposition is to be conducted is maintained at a temperature above the condensation temperature for the vapor phase reactants and below the thermal decomposition temperatures. ALD is a chemically self-limiting process in which alternating pulses of source chemicals saturate the substrate and leave no more than a monolayer of material per pulse. The source chemicals are selected to ensure self-saturating reactions because at least one pulse per cycle leaves a chemisorbed species with a surface termination that is non-reactive with the gas phase reactants of the same pulse. Such a termination is left by "tails" or ligands of the source chemical, such as organic tails or halide tails. A subsequent pulse of a different reactant reacts with the tails left on the chemisorbed layer of the previous pulse to enable continued deposition. Thus, each cycle of alternated pulses leaves no more than about one monolayer of the desired material on the substrate. The principles of ALD type processes have been presented by T. Suntola, e.g., in the Handbook of Crystal Growth 3, Thin Films and Epitaxy, Part B: Growth mechanisms and Dynamics, Chapter 14, Atomic Layer Epitaxy, pp. 601-663, Elsevier Science B.V. 1994.

ALD facilitates the formation of thin films monolayer by monolayer. The skilled artisan will understand that control exists on a smaller than monolayer scale, due to steric hindrance of bulk source chemical molecules producing less than one monolayer per cycle. The capability of layering atomically thin monolayers enables forming more precise concentration gradients from the lower surface, for example, at the gate dielectric/silicon substrate interface, to the upper surface, for example, at the gate electrode/gate dielectric interface.

Accordingly, each discrete monolayer, or partial monolayer, can be tailored by selectively introducing the desired chemistry for each monolayer to be deposited. For example, by means of ALD, a particular combination of introduced gases react with, deposit or adsorb on the substrate until, by the nature of the deposition chemistry itself, the process self-terminates. Regardless of the length of exposure, the process gases do not contribute significantly to further deposition. To deposit subsequent monolayers, different chemical combinations are introduced into the process chamber that will react with or adsorb on the previously formed monolayer. Desirably, the second chemistry or a subsequent chemistry forms another monolayer, also in a self-limiting manner. These self-limiting monolayers are alternated as many times, by repeating cycles, as desired to form a film of suitable thickness.

Each cycle of an ALD process includes a plurality of pulses. In an ALD process, sequential reactant pulses of two different source chemicals are separated in both time and space to avoid gas phase reaction, as the reactants are typically highly mutually reactive, as described above. For example, after a first reactant pulse, excess reactant and by-product is purged from the reaction chamber with an inert gas, such as nitrogen. In a first pulse, the reactant adsorbs on the substrate in a self-saturating process, leaving no more than about one monolayer of reactant. The reactant typically includes termination ligands that are not reactive with the gas phase of the same reactant pulse. After purging with an inert gas, a second reactant pulse take place and the second reactant reacts with the termination ligands, either stripping or replacing the ligands with another element or molecule of interest for the deposited layer. Excess of the second reactant and by-products are then purged and the cycle starts again with the first reactant, or, alternatively, a third reactant can be introduced. Accordingly, no more than a molecular monolayer of the desired material is formed per cycle. In fact, typically less than a monolayer will form, due to steric hindrance by bulky source chemicals blocking possible reactive sites on the surface or due to limited number of reactive sites on the surface.

In accordance with general trends in semiconductor manufacturing, integrated circuits are continually being scaled down in pursuit of faster processing speeds and lower power consumption. As die area for each device decreases with each technology generation, some circuit designs are using more structures with high aspect ratio features in order to better use available chip area. For example, certain dynamic random access memory (DRAM) capacitors employ deep trenches. Such trenches can be very narrow and deep, having aspect ratios of 40:1 or greater. As the packing density of devices increases, each semiconductor device must still meet certain requirements. For example, each DRAM capacitor must still maintain a certain minimum charge storage to ensure reliable operation of the memory cell without excessive refresh cycling. Further, future DRAM trench capacitors require high-k dielectric films, which are more effective when the films are conformally formed. Other examples of devices requiring high step coverage or high aspect ratio features include microelectromechanical systems (MEMS) devices, in which surfaces to be coated often entail reaching through holes to cavities with reentrant profiles, such as MEMS pressure sensors, microfluidic ejection heads, etc.

As used herein, conformality refers to substantially complete coverage of a target surface. However, it is not straightforward to uniformly deposit materials directly over high aspect ratio structures in order to create thin films that meet certain specifications for a desired application.

ALD processes, similar to those described above, have yielded inconsistent results in forming conformal thin films directly over high aspect ratio features. For example, as presented in Schroeder et. al., "Recent Developments in ALD Technology For 50 nm Trench DRAM Applications," ECS Transactions, 1 (5), pages 125-132 (2006) 10.1149/1.2209261 (hereinafter referred to as "Schroeder"), ALD growth of $HfO_2$ (hafnium oxide) from precursors $HfCl_4$ (hafnium chloride) and $H_2O$ (water) was not successful in achieving acceptable "step coverage" in high aspect ratio trenches, while ALD processes with TEMAH (Tetrakis ethyl methyl amino hafnium, also referred to as "TEMAHf" or "TEMAH") and $O_3$ (ozone) produced better results. As used herein, step coverage of a substrate feature having a given aspect ratio, such as a trench, refers to the ratio of deposited film thickness at the bottom of the feature to the deposited film thickness on the top surface of the substrate. It is understood that the bottom of a feature has a deposited film thickness that is typically less than or equal to that of the top surface of the substrate, and that a high step coverage is typically less than but close to 1.0. Schroeder hypothesized that the poor step coverage achieved from the use of $HfCl_4$ and $H_2O$ was due to high or low sticking probability of the precursors.

ALD has been used to form thin films directly over trenches in DRAM capacitors, as disclosed in U.S. Pat. No. 6,780,704 issued to Raaijmakers et al. This prior art achieved high step coverage in creating a thin film over a DRAM capacitor during an ALD process operating at a temperature of 150-350° C.

FIG. 1 illustrates undesirable results in attempting to form a conformal thin film directly over a high aspect ratio feature, such as efforts to form $HfO_2$ from $HfCl_4$ and $H_2O$ in Schroeder. The substrate 166 contains a deep, narrow trench 190 with a thin film 192 achieving 0% step coverage. A skilled artisan will recognize FIG. 1 as exhibiting depletion effects more typically associated with CVD or PVD. In the lower part of the trench 190, there is no thin film to serve as a dielectric, which will not result in a usable DRAM capacitor.

Even some successful processes, such as ALD with precursors TEMAH and $O_3$, have undesirable limitations. For example, TEMAH decomposes at high temperatures, exhibiting deposition and depletion effects sometimes associated with CVD, instead of self-limiting ALD surface reactions and uniform deposition over high aspect ratio features. This decomposition can be minimized or prevented by lowering the temperature of the precursor source vessel, delivery system, and reactor temperature. For example, for TEMAH, the precursor delivery system temperature can be maintained at about 90-150° C. and the reactor temperature can be lowered to about 200-300° C., depending on reactor design. However, these limitations on temperature have drawbacks. Lowering the temperature of the precursor delivery system can reduce the efficiency of bubblers or vaporizers, and lowering the reactor temperature often results in lower quality films with more contaminants and higher leakage current.

Even for applications where the aspect ratio is not extreme, it can sometimes be challenging to supply vapor phase reactant consistently pulse after pulse (for ALD) or wafer after wafer (more generally), particularly where a high volume of the reactant is needed, such as when each wafer receives a very thick film and/or a very large surface needs to be coated. Examples include large format deposition tools for flat screen applications, batch deposition reactors or roll-to-roll coating on flexible substrates.

Accordingly, there is a need for achieving high film quality in an economical way while producing high quality semiconductor devices and associated structures.

SUMMARY

In one aspect, an apparatus for vapor deposition is provided, comprising a reaction space, a first plurality of vessels, and a controller. The reaction space is configured to receive a substrate. The first plurality of vessels is in fluid communication with the reaction space. Each vessel of the first plurality of vessels contains a first source chemical. The controller is programmed to cause delivery of pulses of gas containing the first source chemical from at least two of the first plurality of vessels to the reaction space during a deposition.

In another aspect, a method of depositing material on a substrate is provided. The method comprises providing the substrate in a reaction space, and, after providing the substrate, delivering pulses of a vapor containing a first source chemical to the reaction space from at least two separate source vessels simultaneously.

In another aspect, a method for atomic layer deposition (ALD) is provided. The method comprises providing a substrate; and forming a conformal thin film directly over the feature by alternatingly exposing the substrate to a first reactant species and a second reactant species in a plurality of ALD cycles. The first reactant species is supplied from a plurality of separate sources during forming the conformal thin film.

In still another aspect, a method of depositing material on high aspect ratio features of a substrate is provided. The method comprises providing a substrate with a trench having an aspect ratio of at least 10:1; and exposing the substrate alternatingly to a first precursor and a second precursor in a plurality of atomic layer deposition cycles to form a thin film having at least 80% step coverage directly over the trench. The first precursor comprises a metal halide.

In yet another aspect, a semiconductor device comprises a semiconductor substrate having an upper surface and a trench extending downward from the upper surface. The trench has an aspect ratio of at least 10:1. A conformal dielectric film is deposited on the upper surface of the substrate and within the trench, the film having a step coverage of at least 90%.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other aspects of the present disclosure will be readily apparent to the skilled artisan in view of the description below, the appended claims, and from the drawings, which are intended to illustrate and not to limit the invention, and wherein:

FIG. 1 is a cross-sectional view of a high aspect ratio structure over which a deposited film exhibits depletion effects.

FIG. 2 is a cross-sectional view of a high aspect ratio structure with high step coverage.

DETAILED DESCRIPTION OF THE PREFERRED EMBODIMENTS

Figure 3:
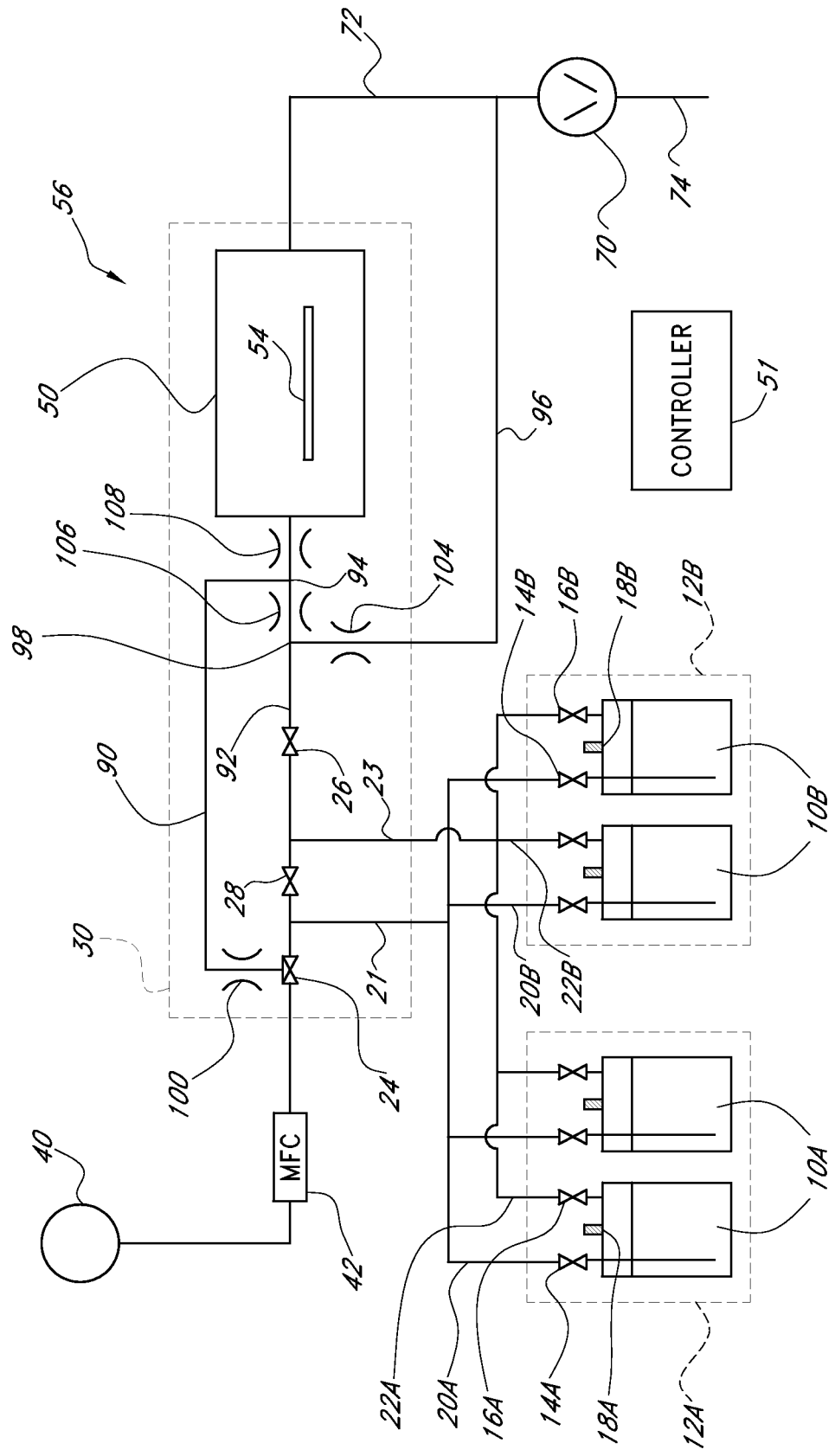
FIG. 3 is a schematic drawing of an ALD system showing two source vessels coupled to a reactor.

Skilled artisans appreciate that it is desirable to deliver high and repeatable doses having substantially consistent concentrations of the source chemicals to the reaction space, such as a reaction chamber. High doses are important, especially when the surface area of the substrate is increased by features, such as vias, trenches, and hemispherical silicon grain ("HSG") or other complex or hard to reach structures, such as cavities. High doses become even more important when such structures have a high density and/or the substrate is large.

In contrast to FIG. 1, described above, FIG. 2 illustrates very desirable results in forming a conformal thin film directly over a high aspect ratio feature, such as a trench with an aspect ratio of at least 10:1, 20:1, or 40:1. The deep, narrow trench 190 of the substrate 166 has a thin film 192 formed directly thereon. As used herein, step coverage of a film deposited on a trench within a substrate refers to the ratio of the film thickness at the bottom of the trench to the film thickness at an upper surface of the substrate, outside of the trench. For example, in FIG. 2, the step coverage of the film 192 on the trench 190 is the ratio of the film thickness at the horizontal bottom surface 194 to the film thickness at the top surface 196 of the substrate. The illustrated film 192 is conformal and preferably has a step coverage of at least 80%, more preferably at least 90%, and even more preferably at least 95%. This will provide an excellent dielectric for a DRAM capacitor. The thickness of the thin film 192 of FIG. 2 is notably more uniform than that of the thin film 192 in FIG. 1. Conformal films with uniform thickness are very desirable. Non-uniform films are problematic because film portions with less thickness allow more leakage current, and portions with greater thickness can store too much charge, which in turn consumes too much power and can cause the capacitor to take too long to switch. A skilled artisan will appreciate that a pure ALD process tends to create conformal films.

Attempts to increase the doses of the source chemicals in ALD processes have involved either increasing pulse time or pulsing multiple times. However, one problem with increasing pulse time in vapor deposition apparatuses, such as ALD or CVD reactors, is that a mere increase in pulse time does not compensate for the increased surface area of the substrate, as the precursor concentration typically drops quickly with increased or longer pulse times. A mere increase in pulse time typically results in diminished concentration of the vapor reactant. For example, in a standard ALD process in which $HfCl_4$ is pulsed using only one source vessel, even lengthening the pulses of $HfCl_4$ generally does not result in good step coverage in trenches as the available concentration of reactant reduces with length of the pulse. Similarly, simply pulsing the same source chemical multiple times consecutively, without sufficiently long recovery times between pulses for the available dosage concentration to replenish, also leads to diminished precursor concentration in each subsequent pulse. Thus, precursor concentration cannot be increased simply by pulsing the same source chemical multiple times unless long recovery times are also provided. Long recovery times result in long cycle times as well as increased cost, which are undesirable. Increasing the source vessel temperature can increase the available concentration; however, increasing the temperature is often not a viable option, as limitations are raised by reliability issues for the deposition, such as by decomposition of precursors at high temperatures.

The following detailed description of the preferred embodiments and methods presents a description of certain specific embodiments to assist in understanding the claims. However, one may practice the present invention in a multitude of different embodiments and methods as defined and covered by the claims.

The drawings illustrate certain embodiments. It will be appreciated that the apparatuses may vary as to configuration and as to details of the parts, and that the methods may vary as to the specific steps and sequence, without departing from the basic concepts as disclosed herein.

The embodiments described herein can be employed for providing reactants for any suitable chemical reaction, and more particularly for providing high and repeatable doses having a substantially consistent concentration of a source chemical in vapor deposition processes. The embodiments described herein can be applied used in conjunction with any number of different types of vapor reactors, including single substrate reaction chambers, batch reaction chambers, reaction spaces of roll-to-roll treatment systems, large format reaction spaces or chambers for flat panel or solar panel use, etc. The embodiments have particular utility for use with a vapor deposition reactor, such as a CVD or ALD reactor.

As will be understood by the skilled artisan, the vessels described herein are typically provided with heaters to maintain a high partial pressure of the source chemical within the vessel. Additionally, a vacuum is preferably applied to the vessel to reduce the absolute pressure therein, which improves the vaporization rate. Typical pressures inside the vessels during operation are in the range of 5 mbar to 400 mbar, and more preferably between about 10 mbar and 200 mbar. In some implementations, the pressure inside the vessels is higher than the pressure of the reaction chamber during a deposition process. Depending upon the reactants and the process employing it, atmospheric pressures are also possible for some embodiments.

FIG. 3 is a schematic drawing of an embodiment of an ALD apparatus. Source vessels 10A and 10B (collectively referred to herein with reference numeral 10) shown in FIG. 3 are positioned in temperature-controlled environments 12A and 12B, respectively. As explained below, the vessels 10A contain a first source chemical, and the vessels 10B contain a second source chemical. While only two vessels for each type of reactant are shown, any number of vessels 10A can be provided, as well as any number of vessels 10B. Furthermore, additional pluralities of vessels (e.g., 10C, 10D, etc.) can be provided for additional types of reactant for more complex process recipes (e.g., complex oxides with numerous elements or nanolaminates), or simply for flexibility to run different processes on different substrates.

Each vessel 10 is connected to an inlet 20. In particular, vessels 10A are connected to inlets 20A, and vessels 10B are connected to inlets 20B. The inlets 20 are provided to receive inactive carrier gas, such as, for example, nitrogen, from a gas line 21. Each vessel 10 is also connected to an outlet 22. In particular, vessels 10A are connected to outlets 22A, and vessels 10B are connected to outlets 22B. Each outlet 22 is configured to output a gas mixture that is generated in the source vessel 10. Thus, inactive carrier gas flows into the vessel 10 via the inlet 20 and mixes with the source chemical inside the vessel 10. The resulting gas mixture exits the vessel 10 via the outlet 22. Although not shown, check valves may be provided in the gas lines connected to the source vessels 10 in order to enforce intended flow directions.

While illustrated as sharing a single inert gas source connected to gas line 21, it will often be advantageous for each of the vessels to be connected to its own mass flow controller (MFC) and/or its own inert gas source to allow for simultaneous pulsing from multiple vessels. Similarly, each vessel can have separate outlets and lines to the reaction chamber, rather than sharing a gas line 23 as shown and separate inert gas valving arrangements (described below with respect to junction 98) can be provided along each line to the reaction chamber. The temperatures for vessels for different reactants can be kept at different temperatures. For example, the vessels 10A could contain solid or liquefied HfCl4 and be heated for vaporization, whereas the vessels 10B, or a single vessel 10B, could contain unheated water.

During the deposition process, which is described below, each temperature-controlled environment 12A, 12B is desirably maintained at a temperature above the condensation temperature of the source chemical contained within the source vessel 10A, 10B, but below the thermal decomposition temperatures of the source chemical. In some embodiments, the temperature of each temperature-controlled environment 12A, 12B is between about 30° C. and 300° C., more typically in the range of between about 50° C. and 250° C., and even more particularly between about 70° C. and 150° C. For example, as mentioned above, the vaporization of the hafnium precursor TEMAH is typically in the range of 90° C. to 150° C.

According to this embodiment, manual inlet isolation valves 14A, 14B and outlet isolation valves 16A, 16B can be used for isolating the vessels 10A, 10B from the surrounding conduits and room atmosphere when a depleted source vessel 10 is replaced with a refilled source vessel. Each source vessel 10A, 10B preferably has, respectively, a refill port 18A, 18B that can be used for adding additional source chemical to the vessel 10. In some arrangements, the port 18 is provided in fluid communication with an auto-refiller to maintain a minimum level of the source chemical in the vessel 10.

In the illustrated embodiment, a three-way valve 24, which can be computer-controlled, directs inactive carrier gas from an inactive gas source 40 to either the source vessels 10 or to a by-pass line 90. A computer-controlled source valve 26 is used for regulating the flow of gas mixture from the vessels 10 to a reaction chamber 50. It will be understood that the principles described herein are more generally applicable to reaction spaces that do not necessarily have well-defined chambers for confining reaction, such as some continuous belt or roll-to-roll systems. A by-pass valve 28, which can also be computer-controlled, is used for purging the inlets 20 and outlets 22 of residual source chemical vapor before a depleted source vessel 10 is replaced with a fresh vessel, as disclosed below. The by-pass valve 28 is kept closed during deposition processes. The valves 24, 26, 28 are preferably placed in a temperature-controlled environment 30 to prevent the condensation of the source chemical vapor at these valves 24, 26, 28. Typically all of the gas lines from the vaporizing vessels 10A, 10B to the reaction chamber 50 are heated at temperatures close to the corresponding vessel temperature to minimize condensation.

A reactor 56 includes a reaction chamber 50 in which a substrate 54 is processed. The reaction chamber 50 and several below-described valves 24, 26, and 28 are located within a temperature-controlled environment 30. The reaction chamber 50 is in fluid communication with chemical sources, including the source vessels 10 through a source conduit 92, and is also in fluid communication with a vacuum pump 70 through an exhaust conduit 72. The vacuum pump 70 has an outlet 74 for gases. A back-suction conduit 96 is in fluid communication with the exhaust conduit 72 and in fluid communication with the source conduit 92 at a junction 98 that is placed between the reaction chamber 50 and the source valve 26. A back-suction restrictor 104, such as a capillary, restricts the flow rate of gases through the back-suction conduit 96 to the exhaust conduit 72.

A by-pass restrictor 100, such as a capillary, may be provided to restrict the flow rate of inactive gas from the three-way valve 24 through the by-pass conduit 90 that is connected to the source conduit 92 at a connection point 94. The connection point 94 is placed in the source conduit 92 between the reaction chamber 50 and the junction 98 of the back-suction conduit 96. In the illustrated embodiment, flow rate restrictors 106, 108, such as capillaries, are placed in the source conduit 92 on both sides of the by-pass conduit connection point 94 to form a gas diffusion barrier volume, as explained below, between the flow rate restrictors 106, 108. The illustrated flow rate restrictors 100, 104, 106, 108 are inside temperature-controlled environment 30 to enable fast purging of the conduits 90, 92.

A controller 51 can be provided to control the positions of one, some, or all of the valves 14, 16, 24, 26, and 28, as well as a mass flow controller 42, described below. For example, the valves can be electrically controllable, such as via a solenoid or other electrical apparatus, and the controller 51 can be configured to electrically control the valves. The controller 51 can be configured to control the valves between their open and closed positions based on programmed process recipes. For example, in one embodiment the controller 51 is programmed to control the valves to pulse the same source chemical from separate source vessels 10 alternately, as described below. In another embodiment the controller 51 is programmed to control the valves to pulse the same source chemical from separate source vessels 10 simultaneously, also as described below. Thus, the controller 51 can be programmed to cause delivery of either simultaneous or alternating pulses of gas from the vessels 10 to the reaction chamber 50.

According to the embodiment of FIG. 3, at least two different source chemicals are alternately pulsed from source vessels 10 to the reaction chamber 50 to process a substrate 54 during an ALD process. According to this embodiment, at least one of the source chemicals is supplied by at least two separate source vessels 10 that are fluidly connected to the same reaction chamber 50. For example, one source chemical can be supplied by two or more vessels 10A, and another source chemical can be supplied by two or more vessels 10B. The pulses of the different source chemicals can be separated with inactive gas flow that purges the reaction chamber 50, although other means are known for keeping the different source chemicals separate spatially and temporally. For simplicity, FIG. 3 shows two source vessels 10A and two source vessels 10B. However, it will be understood that different numbers of vessels 10A, 10B can be provided, with preferably at least one of the source chemicals being provided by more than one source vessel. For example, the reactor 56 can include two or more vessels 10A (containing a first source chemical) and one or more vessels 10B (containing a second source chemical).

A typical ALD pulsing sequence consists of four basic process steps: source chemical A pulse, purge A, source chemical B pulse, purge B. The pulsing sequence is repeated as many times as is needed for obtaining a thin film of desired thickness. According to an embodiment, during the pulsing of source chemical A, at least two separate source vessels 10A supply source chemical A to the reaction chamber 50. After the source chemical A pulses from the two separate source vessels, the purge A takes place. During the purge A step, the reaction chamber 50 is purged of residual reactant A, using a purge or inactive gas from the inactive gas source 40. The purge A step is followed by the pulsing of source chemical B. According to an embodiment, during the pulsing of source chemical B, at least two separate source vessels 10B supply source chemical B to the reaction chamber 50. The source chemical B pulses are then followed by the purge B step during which the reaction chamber 50 is purged of residual source chemical B, using the purge gas from an inactive gas source 40. It will be understood that source chemical A and source chemical B are different source chemicals. When stored in vessels 10, the source chemicals can be in vapor, liquid, or solid form, or any combination thereof. However, the presently disclosed embodiments are particularly useful for source chemicals that are in powder form, or source chemicals that have low vapor pressures, such as less than 0.1 mm Hg at atmospheric pressure and room temperature.

Two or more vessels 10 can be used to pulse the same source chemical simultaneously or in an alternating fashion. The doses of a source chemical, such as, for example, $HfCl_4$, $TiCl_4$, or $ZrCl_4$, can be increased at every pulse using a vapor deposition apparatus in which two or more vessels 10 containing the same liquid or solid source chemical are used to deliver the same source chemical to the reaction chamber 50, either simultaneously or in an alternating fashion. Thus, in the illustrated embodiment, two or more source vessels 10A are used to pulse source chemical A to the reaction chamber 50, and an additional two or more source vessels 10B are used to pulse source chemical B to the reaction chamber 50. It will be appreciated that, in some embodiments, one or more of the source chemicals are provided from multiple source vessels, while one or more other source chemicals are provided from single source vessels.

As discussed above, consistently high doses are important, especially for high aspect ratio applications, where the surface area of the substrate is increased by features such as vias, trenches, cavities, hemispherical silicon grain ("HSG") and other complex features, and/or for high density features (regardless of aspect ratio) and/or thick layer deposition, i.e., whenever vaporized sources are subject to depletion. The skilled artisan will readily appreciate that a higher dose of each source chemical is desirable for reaching down into the depths of the features, as compared with a planar surface of a substrate. As mentioned above, merely increasing the pulse time of each pulse, using a single source vessel for each source chemical does not result in the desired thickness in such features because the source chemical concentration drops off as the pulse time is increased. The concentration drop-off depends on the precursor, the source design, the source temperature, the carrier gas flow/pressure, the pulse time and the previous usage of the source (namely how long the source was idle before the pulse or whether it had been continuously pulsing). Extending the pulse time excessively tends to deplete the vessel, which results in a drop-off in the thickness of the deposited layer as the depth of the feature and/or density of structures over the substrate increases. One example of a suitable vessel is the so-called LPV (Low Profile Vessel) available commercially from ASM America, Inc. or Phoenix, Ariz. The controller 51 can be programmed so that the pulses have a substantially consistent concentration of the source chemical. Further, the controller 51 can be programmed to cause delivery of said pulses for pulse durations in a range between about 0.1 second and 10 seconds.

The skilled artisan will appreciate that the embodiments described herein, using at least two source vessels to pulse each source chemical, are especially suitable for deposition processes using low volatility source chemicals, such as $HfCl_4$, $ZrCl_4$, $TiCl_4$, $La(thd)_3$, $La(iPrCp)$, $Ti(OMe)_4$, $Sr(t-BuCp)_2$, $TaCl_5$, and $AlCl_3$, for ALD processes for coating surfaces of high aspect ratio trenches and other features.

According to an embodiment, the controller 51 is programmed to deliver alternating pulses of the same source chemical from two or more different source vessels 10. Alternating pulses allows for longer recovery or replenishing times between pulses for each source vessel 10. Alternate pulsing involves pulsing a reactant gas of one source chemical from one vessel 10 to the reaction chamber 50, and thereafter pulsing a reactant gas of the same source chemical from another vessel 10 to the chamber 50. The longer recovery time between pulses allows for delivering doses having a substantially consistently high concentration of the source chemical to the reaction chamber 50 at every pulse. When one source vessel 10 is pulsed, another source vessel 10 has the time to generate source chemical vapor, which will be enough to saturate surfaces of features, such as trenches, in the substrate 54. The skilled artisan will appreciate that a consistently high dose is desirable, especially for materials with low vapor pressure, such as less than 0.1 mm Hg at atmospheric pressure and room temperature. The alternating of the pulses can be done with or without purging between the pulsing of the two or more vessels 10 containing the same source chemical. It will be understood that alternate pulsing can be conducted with two or more vessels 10, simply by pulsing the vessels consecutively. The alternated pulses of the same reactant from two different vessels can be conducted within a deposition cycle (e.g., for ALD) or in different consecutive deposition cycles. In yet another embodiment, one vessel can be employed for the deposition on one wafer (or batch), and another vessel for deposition on the next wafer (or batch). In general for ALD sequences, each pulse can have a duration between 0.1 s and 10 s, more typically 0.3 s to 5 s. Time between pulses can vary from 0 s to 10 s or longer, particularly if other reactant pulses and purge steps are desired between pulses from the vessels of the same reactant chemical. Actual durations and pulse separation (if any) will depend upon a variety of factors, including but not limited to relative surface area compared to a planar substrate, depth of features (e.g., trench, via, pillar, protrusion, bump, etc.), number of vessels employed for a single reactant chemical, particular reactant choice, etc. The vessel size can similarly vary, but preferably can accommodate sufficient amounts of the reactant to last for a full run before the chamber needs to be shut down for regular maintenance anyway. For typical commercial ALD processes, this translates to about 200 g to 2000 g of precursor material.

In another embodiment, the controller 51 is programmed to deliver simultaneous pulses of the same source chemical to the reaction chamber 50 from separate source vessels 10. Simultaneous pulsing involves delivering a gas from a first vessel 10 and a second vessel 10 at the same time. Simultaneous pulsing of the same source chemical provides for high and repeatable doses having a substantially consistent concentration of the source chemical to the reaction chamber 50. The skilled artisan will appreciate that simultaneous pulses from two separate source vessels 10 containing the same source chemical to the same reaction chamber 50 results in a doubled dose of the source chemical with each simultaneous pulse. Similarly, simultaneous pulsing from three separate vessels 10 containing the same source chemical to the same reaction chamber 50 results in a tripled dose of the source chemical. The skilled artisan will appreciate that the more source vessels 10 used for simultaneous pulsing of the same source chemical, the higher the dose of the source chemical to the reaction chamber 50. It will be understood that simultaneous pulsing allows for higher doses while using standard sized vessels. Simultaneous pulses can begin and end at different times, so long as portions of the pulses overlap in time. Thus, simultaneous pulses need not have synchronized start and end times. However, it may be desirable to deliver the pulses with substantially synchronized start and end times. The increased dosage enables reduced pulse durations, thus increasing throughput.

Referring to FIG. 3, in one embodiment, during pulsing of source chemical A, an inactive gas, such as nitrogen or argon, flows from the inactive gas source 40, preferably through a mass flow controller 42. The three-way valve 24 guides the inactive gas to the gas line 21 toward the source vessels 10, and the valve 28 prevents the inactive gas from flowing toward the source valve 26 and reaction chamber 50. The inactive gas flows to the inlets 20. The inlet valves 14A and outlet valves 16A are opened to allow the inactive gas to flow through the source vessels 10A. Evaporated source chemical A diffuses with the inactive gas inside the source vessels 10A and flows as a gas mixture through the outlets 22A into the gas line 23. This gas mixture flows through gas line 23 back to the temperature-controlled environment 30. The inlet valves 14B are closed to prevent the inactive gas from flowing through the source vessels 10B, which contain source chemical B.

The source valve 26 allows the gas mixture to flow/pulse to the reaction chamber 50 from the source vessels 10A. The apparatus illustrated in FIG. 3 is capable of pulsing reactant gases from the two source vessels 10A either simultaneously or in an alternating fashion, as described above. The pulsing of the gas mixtures from each of the source vessels 10A can be controlled by each source vessel's respective outlet valve 16A. In the reaction chamber 50, the source chemical molecules of the gas mixture containing source chemical A chemisorb on the substrate 54 surface until available reactive surface sites have been filled with the molecules and the chemisorption process saturates, leaving no more than one molecular layer of the source chemical A molecules or their chemisorbed fractions on the surface of the substrate 54.

During a purge A step, which follows pulsing of source chemical A from at least two separate source vessels 10A, the source valve 26 is kept closed and the three-way valve 24 guides the flow of the inactive gas from the inactive gas source 40 through the by-pass conduit 90 to a gas diffusion barrier volume that is located in the vicinity of the connection point 94. The inactive gas flow divides into two parts at the connection point 94 with the help of flow rate restrictors 106, 108. The restrictors 106 and 108 are configured so that about 90% of the inactive gas flows to the reaction chamber 50 and purges the residual source chemical A out of the reaction chamber 50 and into the exhaust conduit 72. About 10% of the inactive gas flows backwardly through the source conduit 92 to the junction point 98 of the back-suction conduit 96, and then the inactive gas flows through the back-suction conduit 96 to the exhaust conduit 72 and finally to the vacuum pump 70. The backward flow though the source conduit 92 ensures that source chemical molecules do not diffuse along the source conduit 92 to the reaction chamber 50 during the purge period. Variations on this arrangement, which can be referred to as inert gas valving (IGV), employing choked or non-fully-closing valves in place of restrictors, are described in U.S. Pat. No. 6,881,263 and U.S. Patent Publication No. 2010-0266765 A1, the entire disclosures of which are incorporated herein by reference. Separate IGV arrangements can be provided for each reactant or each vessel 10A, 10B.

The skilled artisan will readily appreciate that after purging of residual source chemical A from the reaction chamber, a second source chemical, source chemical B, can be pulsed from two separate source vessels 10B and purged in a similar fashion. Source chemical B can also be pulsed from two or more source vessels 10B in either an alternating fashion or simultaneously, as discussed above. Thus, at least four source vessels 10 can be provided to supply two different source chemicals to the chamber 50, with at least two source vessels 10 supplying each source chemical.

Figure 4:
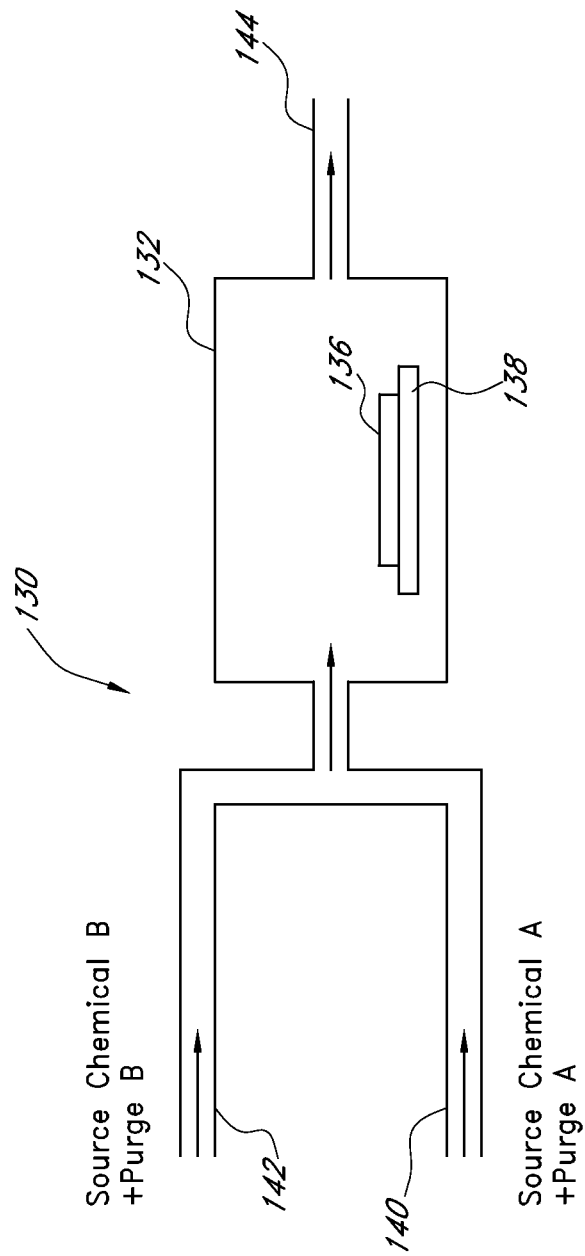
FIG. 4 is a cross-sectional view of an embodiment of a vapor deposition reactor.

An embodiment of a vapor deposition apparatus or reactor 130 is shown in FIG. 4. According to this embodiment, the doses of a source chemical can be increased at every pulse using a vapor deposition apparatus in which two or more source vessels, which are not shown in FIG. 4 for simplicity, containing the same liquid or solid source chemical are used to deliver the same source chemical to a reaction chamber 132. The doses can be delivered either simultaneously or in an alternating fashion, as described above. The skilled artisan will readily appreciate that the source vessels and conduits, as well as the valves, mass flow controllers, etc., supplying and controlling fluid flow to the reaction chamber 132 shown in FIG. 4 can be similar to those shown in the schematic drawing of FIG. 3. During processing, a wafer or substrate 136 is disposed within the reaction chamber 132 and is supported by a substrate holder 138. The reactor 130 can include a wafer inlet/outlet port and an external robot with a robot arm for transporting substrates, which are not show for simplicity.

As shown in FIG. 4, two different source chemicals are supplied to the reaction chamber 132. A first source chemical (source chemical A) is supplied to the reaction chamber 132 through a first conduit 140 by two or more source vessels, which are shown in FIG. 3. A second source chemical (source chemical B) is supplied to the reaction chamber 132 through a second conduit 142 by two or more source vessels. Thus, each supply conduit 140, 142 is connected to at least two source vessels and preferably an inactive gas source, which is also illustrated schematically in FIG. 3. The skilled artisan will appreciate that the inactive gas can be used as a purge gas or a carrier gas to transport the first and/or second source chemicals to the reaction chamber 132. As shown in FIG. 4, an exhaust 144 is provided for removing material, such as excess reactant or by-products, from the reaction chamber 132. For simplicity, the different conduits and valves connecting the source vessels and inactive gas supply to the reaction chamber 132 are not shown in FIG. 4, but they can be similar to those shown in FIG. 3 and described above.

Figure 5:
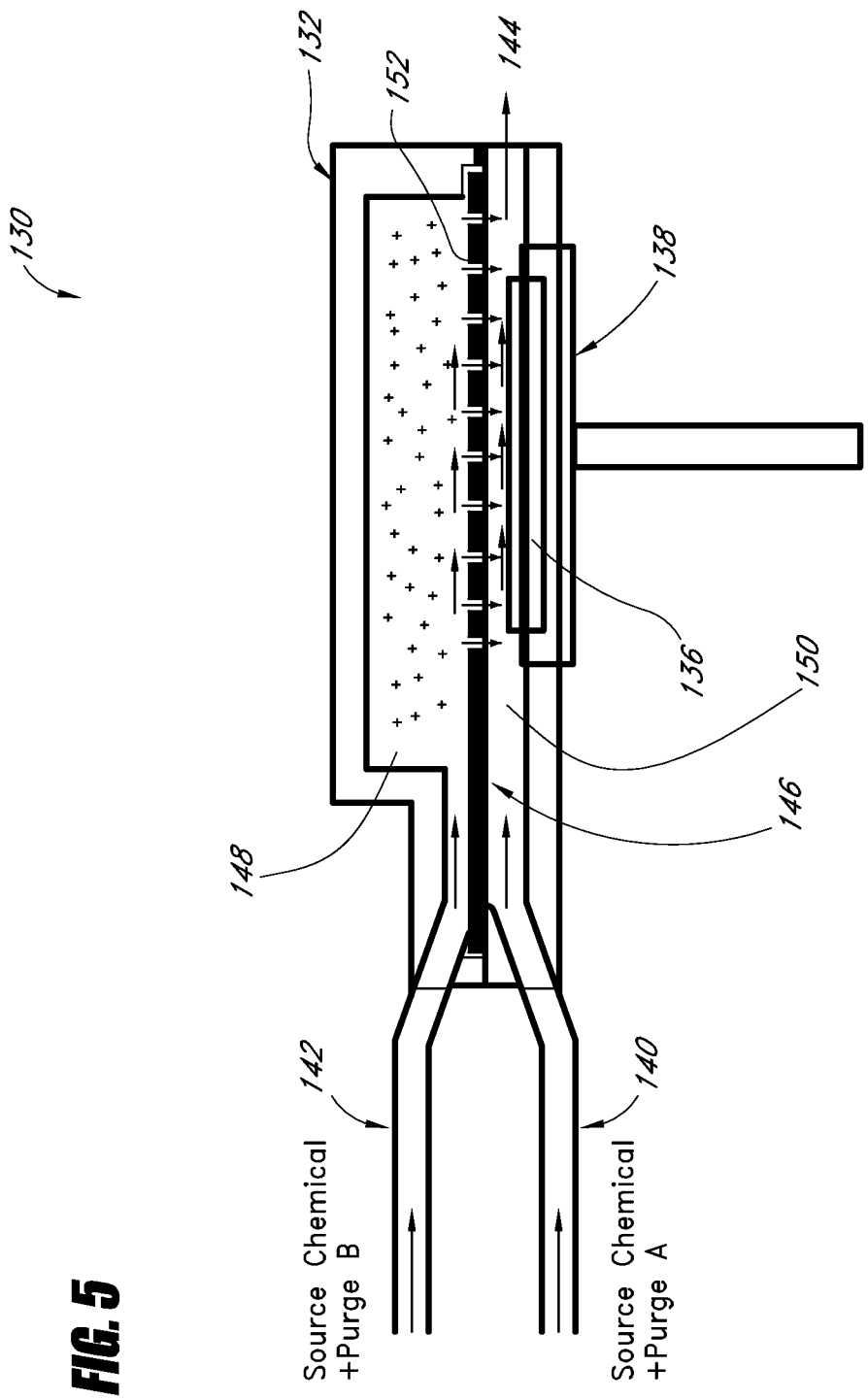
FIG. 5 is a cross-sectional view of another embodiment of a vapor deposition reactor.

FIG. 5 shows another embodiment, which is similar to that of FIG. 4, except for the presence of a showerhead plate 146 positioned within the reaction chamber 132. Preferably, the showerhead plate 146 is a single integral element and spans across the entire reaction space and divides the reaction chamber 132 into an upper chamber 148 and a lower chamber 150. The showerhead plate 146 defines, at least in part, a plurality of passages 152 that connect the upper chamber 148 to the lower chamber 150. In the illustrated embodiment, such passages 152 are formed by providing openings in the showerhead plate 146 that are located generally above the substrate 136. The skilled artisan will appreciate that the showerhead plate 146 substantially prevents the second source chemical (source chemical B) from entering the lower chamber 150 until the flow from the second source conduit 142 is generally above the substrate 136.

Skilled artisans will appreciate that the methods and apparatuses taught herein, such as those described in connection with FIG. 3, do not require a showerhead plate inside the reaction chamber. Also, embodiments of the present invention include both single substrate reaction chambers as well as multiple substrate reaction chambers. Further, the present invention is not limited to embodiments including a horizontal gas flow reaction chamber. In certain embodiments, the reaction chamber is designed for vertical gas flow, or gas flow in other directions.

Separate reactors that supply the same source chemical, such as the reactors illustrated in FIGS. 3-5, have a wide variety of applications, including forming thin films directly over high aspect ratio structures on a substrate.

Schroeder, discussed above, presents mixed results in forming conformal thin films in trench applications. ALD processes using TEMAHf or TEMASi (Tetrakis ethyl methyl amino silicon) as metal precursors and $O_3$ or $H_2O$ as oxide precursors yielded positive results and reached high step coverage. However, attempts to create an $HfO_2$ dielectric by conducting ALD with precursors $HfCl_4$ and $H_2O$ yielded poor results. Although the film thickness on the wafer surface and along the upper part of the trench exceeded the expected film thickness, no deposition was found at the trench bottom. Typically, this indicates that an insufficient amount of precursor was supplied to the reaction chamber. Attempts to solve this problem by increasing pulse time of the $HfCl_4$ precursor were unsuccessful, and coverage of the lower portion of the trench was not improved. This behavior cannot be explained by a pure ALD process, and the depletion effects observed are more typically associated with a CVD or PVD process. Schroeder asserts that the undesirable results were due to parasitic effects, and more particularly to high or low precursor sticking probability.

For purposes of this application, a high aspect ratio feature has an aspect ratio of 10:1 or greater. High aspect ratio features can have aspect ratios of 10:1, 20:1, 40:1, 50:1, 200:1 or greater. For example, DRAM trenches have been employed with an aspect ratio of 50:1 (0.1 um wide by 5 um deep). As technology generations continue to shrink device sizes, this ratio is likely to increase.

As opposed to the inadequate sticking probability hypothesized in Schroeder, one possible reason that previous experiments encountered depletion effects in depositing a thin film (e.g., $HfO_2$) directly over a high aspect ratio feature could be that in the reported experiments the source chemical (e.g., $HfCl_4$) concentration rapidly decreased after supplying a short initial portion of a vapor dose. In other words, the source chemical concentration of each reactant gas pulse may be initially high, but may drop for the remainder of each pulse. This may cause an insufficient total dose of the source chemical to be supplied during one ALD pulse, thus failing to saturate the full surface of the high aspect ration feature. This may explain why Schroeder could not solve this problem by increasing pulse duration, which is a typical solution for supplying more source chemical.

Certain metal precursors, including metal halides such as $TaCl_5$, $AlCl_3$, $HfCl_4$ and $ZrCl_4$, are solid powders at room temperature and are much more difficult to vaporize and/or sublimate than liquid precursors, including metal organics such as TEMAH. Consequently, such solid metal precursors are more likely to exhibit a drop in source chemical concentration after supplying an initial dose portion.

In addition, large substrates, such as 300 mm diameter wafers, with many high aspect ratio features, such as trenches, can have significantly more total surface area than substrates with fewer high aspect ratio features, substrates with lower aspect ratio features, or flat substrates. On large substrates with many high aspect ratio features, this increased surface area can be very significant. For example, a 300 mm diameter wafer with high aspect ratio trenches can have a total surface area that is 50 times the surface area of a flat bare 300 mm diameter wafer. Therefore, a high total dosage of metal precursor is required to saturate the complete surface of such a substrate with many high aspect ratio structures.

In order to solve the problems encountered in Schroeder, a preferred embodiment of the present application supplies substantially saturated pulses of metal precursor. In one embodiment, separate sources simultaneously supply substantially saturated pulses of a same metal precursor. In another embodiment, separate sources alternately supply substantially saturated pulses of a same metal precursor. Skilled artisans will recognize that there are a variety of ways to saturate pulses of a metal precursor.

Accordingly, a preferred embodiment of the present application creates a uniform deposition of a high quality thin film directly over high aspect ratio structures. This may be achieved by depositing a thin film formed from first and second reactant species during a plurality of ALD cycles. ALD is often conducted with substrate temperatures in the range of 100-500° C., and more typically in the range of 150° C. to 350° C. The first reactant species may comprise a metal precursor. Exemplary metal precursors include organic metal precursors such as $La(thd)_3$, $La(iPrCp)$, $Ti(OMe)_4$, $Sr(tBuCp)_2$, and metal halides, such as $HfCl_4$, $ZrCl_4$, $TiCl_4$, $TaCl_5$, and $AlCl_3$. Exemplary second reactant species include $H_2O$, $O_3$, $O_2$, atomic or excited oxygen, $NH_3$, atomic or excited nitrogen, etc. The deposited thin film can comprise a variety of materials including $HfO_x$, $HfSiO_x$, $HfLaO$, $ZrO_x$, $ZrLaO$, Yttrium stabilized $ZrO_2$, $ZrSiOx$, $LaAlO$, $SrTO$, $Ta_2O_5$, $Al_2O_3$, $HfAlO_x$, $HfTaO_x$, etc.

Figures 6, 7:
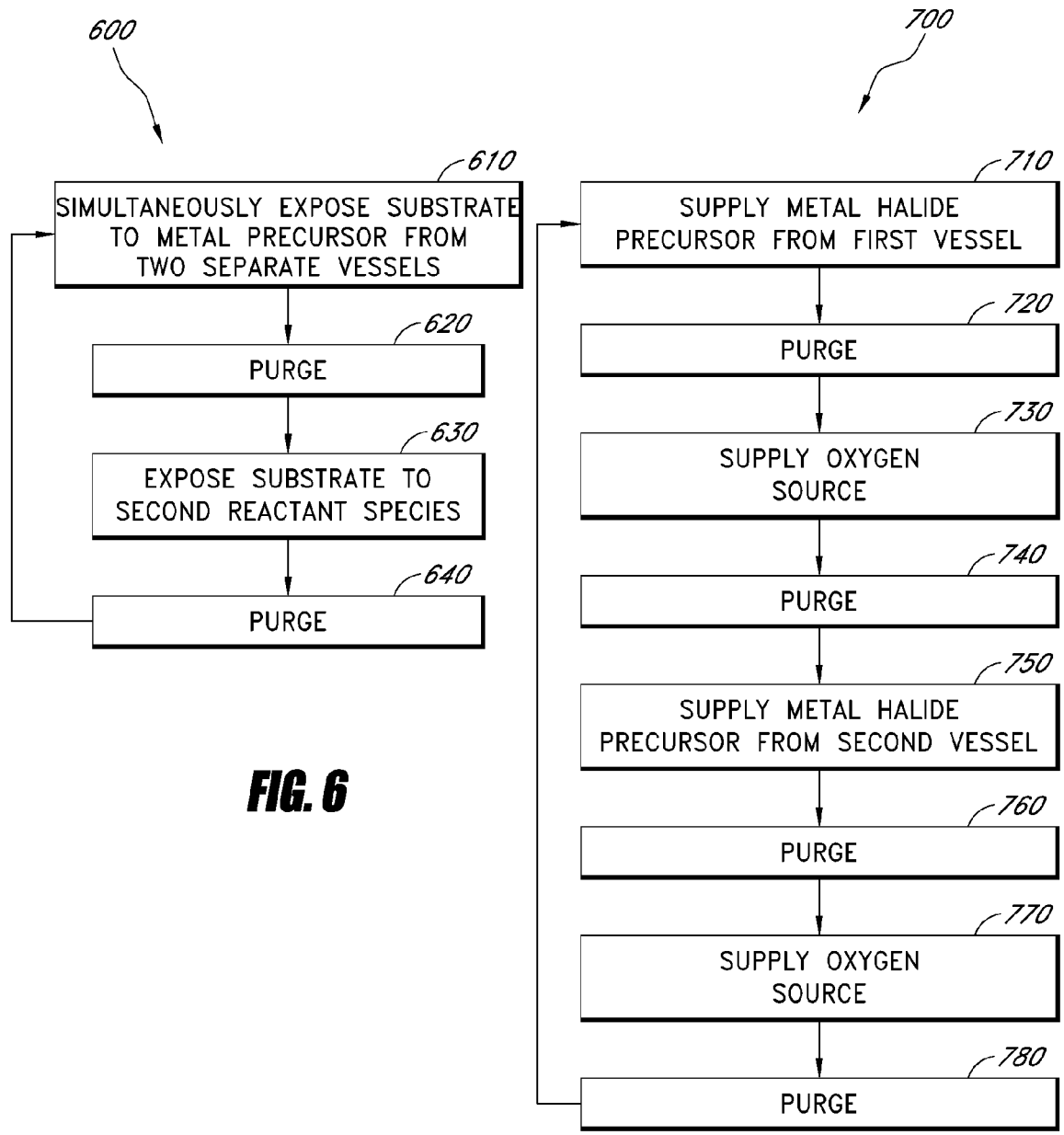
FIG. 6 is a flowchart of an ALD process in which a substrate is exposed to a metal precursor that is simultaneously supplied from a plurality of separate sources.
FIG. 7 is a flowchart of an ALD process in which a metal halide precursor is alternately supplied from a plurality of separate sources.

For exemplary purposes, reference will be made to the reactor of FIG. 1 and its corresponding components in describing FIGS. 6-8. FIG. 6 is a flowchart of an exemplary ALD method 600, in which a thin film is deposited over a high aspect ratio feature in a plurality of ALD cycles. The method 600 comprises simultaneously supplying the same metal precursor from a plurality of separate sources.

In step 610, the substrate 54 is exposed to a first reactant species, in this case a metal precursor, simultaneously supplied to the reaction chamber 50 from each of two or more separate source vessels 10. Simultaneously supplying the metal precursor from multiple source vessels 10 helps to achieve pulse saturation of the metal precursor. In other words, the metal precursor concentration remains high through a majority or a substantial entirety of the pulse duration. The step 610 deposits about a monolayer (or less due to steric hindrance) of adsorbed metal precursor on the substrate 54. Next, in step 620, the reaction chamber 50 is purged with an inert gas that substantially removes excess metal precursor and any processing byproducts in the chamber. Then the substrate 54 is exposed to a second reactant species supplied from one or more separate source vessels 10 in step 630, leaving about a monolayer or less of deposited film from the cycle. In step 640, the reaction chamber 50 is purged with inert gas again, substantially removing excess of the second reactant species and any processing byproducts, such as byproducts of the chemical reaction between the metal precursor layer on the substrate surface and the second reactant species.

The steps 610-640 can be repeated as many times as necessary to create a thin film with suitable thickness for the desired application. For example, creating a 20 nm $HfO_2$ film for a DRAM capacitor dielectric can be deposited in about 360 ALD cycles alternating $HfCl_4$ and $H_2O$ at 300° C. While the above describes theoretically ideal ALD with a monolayer or less deposited per cycle, the skilled artisan will appreciate that the redundant vessels taught herein are also useful for CVD and for variations on ALD in which more than a monolayer per cycle can be deposited.

FIG. 7 is a flowchart of an exemplary ALD method 700, in which a thin film is deposited in a plurality of ALD cycles. As noted above, the method is particularly useful for applications where depletion of low volatility source chemicals is a risk, such as over high aspect ratio features, dense features, large substrates or when particularly thick films are being deposited whether planar or over complex topography. The method 700 comprises alternately supplying the same precursor, in this case a metal precursor, from a plurality of separate sources. The illustrated embodiment involves pulsing a metal halide precursor and oxygen. Pulse saturation (or near-saturation) can be achieved by alternatingly supplying the metal halide precursor from separate sources. This allows each source vessel more time to recover after supplying each pulse of source chemical vapor, which is rapidly depleted when depositing a thin film over a substrate with many high aspect ratio features. More recovery time allows each separate source to replenish its available dosage concentration of source chemical vapor.

In step 710, a metal halide precursor, for example $HfCl_4$, is supplied to the reaction chamber 50 from a first source vessel 10A. This step deposits about a monolayer of adsorbed metal halide precursor on a high aspect ratio feature of the substrate 54. Next, in step 720, an inert gas is supplied to the reaction chamber 50 to remove excess metal halide precursor from the chamber, along with any process byproducts. In step 730, an oxygen source, for example $H_2O$, is supplied to the reaction chamber 50 from a separate source vessel 10B. The reaction chamber 50 is purged again in step 740.

The next time the substrate 54 is exposed to metal precursor, in step 750, a second source vessel 10B, which is different and separate from the first vessel 10B that supplied the first pulse in step 710, supplies the same metal halide precursor. The reaction chamber 50 is then purged in step 760. In step 770, an oxygen source is supplied again. The reaction chamber 50 is purged again in step 780.

The steps 710-780 can be repeated as many times as necessary to create a thin film with suitable thickness for the desired application. For example, creating a 20 nm $HfO_2$ film alternating $HfCl_4$ and $H_2O$ at 300° C. for a DRAM capacitor dielectric can be performed in 360 cycles of the ALD method 700, of which half of the cycles employ the first vessel and half employ the second vessel.

Figure 8:
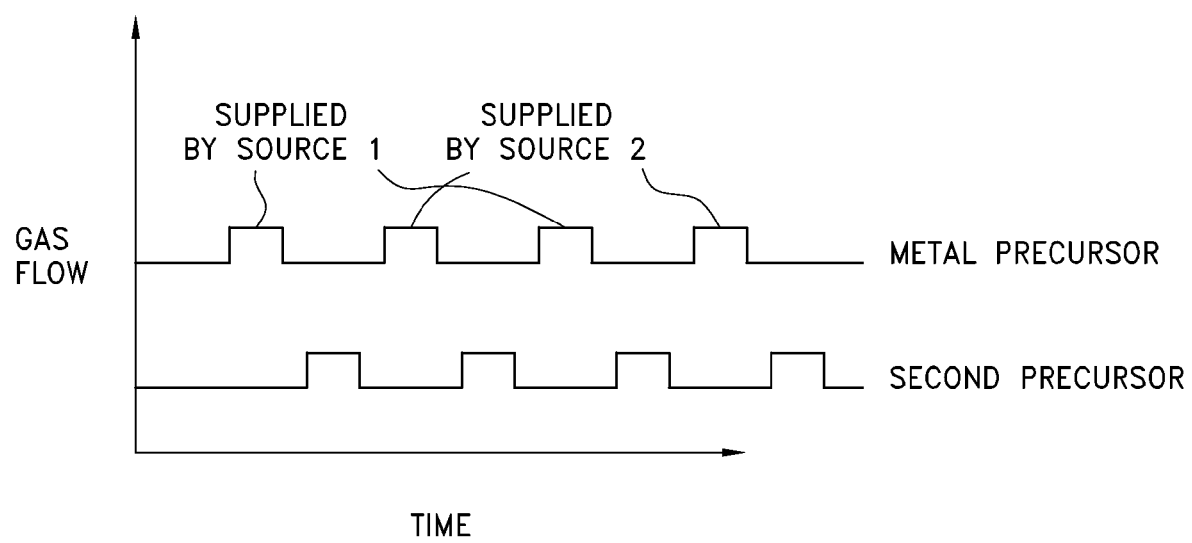
FIG. 8 graphically illustrates gas flow pulses for an ALD process using two precursors, one of which is alternately supplied from separate sources.

FIG. 8 graphically illustrates reactant gas flow pulses as a function of time for an ALD process. For exemplary purposes, reference will be made to the ALD process 700. FIG. 8 corresponds to two cycles of the process 700. Each consecutive pulse of the metal precursor is supplied from a different source vessel than the previous pulse. This alternating of source vessels preferably continues throughout a plurality of ALD cycles, such that each separate source vessel has twice the recovery time than it would have if the metal precursor is pulsed at the same rate as in FIG. 8 with each pulse from the same source vessel.

A skilled artisan will appreciate that there are a variety of ways to alternately pulse a precursor species from separate source vessels. For example, instead of changing the source of the precursor species after every pulse, the source could be changed after every two pulses. This would give the source vessels even more time to generate maximum pulse concentration in certain ALD processes. In other embodiments, the source supplying the precursor species could be changed even less frequently than every two pulses. Furthermore, while FIGS. 7-8 illustrate use of different vessels for supplying the same reactant in alternating cycles, alternate use of the vessels can take many forms. For example, prolonged reactant supply (or increased dose) can be provided in cycle (or at least one cycle) with the following sequence:

First precursor from first vessel
    First precursor from second vessel
    Purge
    Second reactant
    Purge where the two pulses of first precursor can be supplied with or without intervening purge or separation in time. Other sequences are also possible. Furthermore, alternation can also be employed for vapor deposition on one wafer using a first vessel, and switching to a second vessel for the same reactant for deposition on the subsequent wafer. Moreover, alternation and simultaneous supply from redundant vessels can be combined. For example, for continuous vapor deposition in a roll-to-roll reactor, multiple vessels can be simultaneously employed to supply the same reactant, and those multiple vessels can be alternated with another multiple vessels for the same reactant while the first multiple vessels recharge their vapor supply.

Another aspect of the present invention is a high aspect ratio feature formed in accordance with the above described methods. The methods allow film formation on a semiconductor substrate having an upper surface and a trench extending downward from the upper surface, the trench having an aspect ratio of at least 10:1, 20:1, 40:1, 50:1, 100:1, 200:1 or greater. In particular, these methods can be used to deposit a conformal dielectric film on the upper surface of the substrate and within the trench, the film having a step coverage of at least 80%, 90%, or 95%. The dielectric film can comprise a capacitor dielectric, and it can have a dielectric constant of at least 10. In certain embodiments, the deposited film comprises $ZrO_x$ or $HfO_x$. In certain embodiments, the substrate is a silicon substrate, and the trench is formed in the silicon substrate. As explained above, the dielectric film can be formed by pulsing a metal halide vapor. As such, the deposited dielectric film may include halide traces. The trench can comprise a DRAM trench or a memory capacitor trench.

EXAMPLE

As an example, reference is made to Verghese et al., ECS Conference, Los Angeles, Oct. 19, 2005, which describes an ALD process using precursors $HfCl_4$ and $H_2O$ to form a thin film of $HfO_2$ on a substrate without high aspect ratio features. The present inventors used source vessel C described in that publication to conduct an ALD process using these same precursors to deposit a thin film of $HfO_2$ onto a substrate having high aspect ratio features. The source vessel C includes a series of stacked trays, which results in an enhanced exposed surface area. The carrier gas passes through each tray, resulting in continuous maximum pulse saturation. Experiments indicate that such a source design results in delivery of pulses that are substantially saturated with the metal precursor, in this case $HfCl_4$, for the duration of the pulse.

In this experiment using said source vessel C, conformal 20 nm $HfO_2$ and HfSiO films were formed over high aspect ratio trench structures, including 0.11 um×5 um trenches, on a 300 mm wafer. ALD occurred within an ASM Pulsar 3000™ single wafer cross-flow reactor, with a reactor temperature of about 300° C. Ellipsometer and cross-sectional scanning electron microscope inspection of the wafers showed deposited film thicknesses of 20 nm at the bottom of the trenches and at the top surfaces of the wafers.

The successful ALD of certain materials inside deep trenches from solid metals, such as metal halides, allows the formation of uniform thin films at higher reactor temperatures. Unlike certain liquid metal precursors, such as TEMAH, solid metal halides do not decompose at higher temperatures. For example, solid metal halides, such as $HfCl_4$, are stable at temperatures of 400-500° C. In contrast, liquid metal organics, such as TEMAH, decompose at significantly lower temperatures. By using materials that do not decompose at higher temperatures, highly uniform films with 80%-95% or greater step coverage can be created at substrate temperatures of about 350° C., or even temperatures of 350-500° C. Moreover, the higher reactor temperatures produce higher quality films with fewer contaminants and lower leakage currents in semiconductor devices. In addition, higher deposition temperatures enhance the diffusion of species in trenches, and consequently shorten ALD cycle time.

Precursors that do not decompose at higher temperatures allows precursor delivery systems to operate at higher temperatures, enabling very high evaporation/sublimation efficiency and higher pulse concentration. For example, sources of $HfCl_4$ can be operated at temperatures of at least 250° C. As aspect ratios or surface area are further increased for future devices, the temperature of the source can easily be increased to supply the extra precursor dose needed for future technologies. Further, using solid metal halide precursors, such as $HfCl_4$, is typically less expensive than using liquid metal organic precursors, such as TEMAH.

Methods for supplying the same precursor from a plurality of separate sources are applicable to a wide variety of reactors beyond a single wafer cross-flow reactor. For example, single-wafer showerhead reactors or batch reactors can also be used. In particular, batch reactors are generally used with source vessels that can supply reactant gases at higher rates. Batch reactors produce greater wafer throughput than single wafer reactors and are therefore more economical. For example, the methods described above can be used with vertical furnace batch reactors or mini-batch reactors where the transport between wafers is by diffusion. Also, the above-described methods can be used with batch reactors in which a cross-flow configuration is used for each wafer.

The methods described and illustrated herein are not limited to the exact sequences of steps described. Nor are they necessarily limited to the practice of all the steps set forth. Other sequences of steps or events, or less than all of the steps, or simultaneous occurrences of the steps, may be utilized in practicing the embodiments and methods of the invention.

Furthermore, the skilled artisan will recognize the interchangeability of various features from different embodiments. Similarly, the various features and steps discussed above, as well as other known equivalents for each such feature or step, can be mixed and matched by one of ordinary skill in this art to perform methods in accordance with principles described herein.

Although this invention has been disclosed in the context of certain preferred embodiments and examples, it will be understood by those skilled in the art that the present invention extends beyond the specifically disclosed embodiments to other alternative embodiments and/or uses of the invention and obvious modification thereof. Thus, it is intended that the scope of the present invention herein disclosed should not be limited by the particular disclosed embodiments described above, but should be determined only by a fair reading of the claims that follow.

What is claimed is:

1. An apparatus for vapor deposition, comprising:
a reaction space configured to receive a substrate;
a first plurality of precursor source vessels in fluid communication with the reaction space, wherein a first vessel of the first plurality of precursor source vessels contains a first source chemical and is configured to vaporize the first source chemical, and a second vessel of the first plurality of precursor source vessels contains the same first source chemical and is configured to vaporize the first source chemical wherein the first source chemical comprises at least one of a liquid and solid; and
a controller configured to cause delivery of pulses of gas containing the first source chemical from at least two of the first plurality of precursor source vessels to the reaction space during a deposition on a common substrate, wherein the controller is configured to supply the pulses of gas containing the first source chemical from the at least two of the first plurality of precursor source vessels during the deposition on the common substrate, wherein the pulses each includes at least some reactant from the first vessel of the first plurality of vessels, and from the second vessel of the first plurality of vessels, wherein the controller is configured to cause delivery of said pulses for pulse durations in a range between about 0.1 and 10 seconds.

2. The apparatus of claim 1, wherein the first source chemical is a solid.

3. The apparatus of claim 1, wherein the first source chemical is a liquid.

4. The apparatus of claim 1, wherein the first source chemical is $HfCl_4$.

5. The apparatus of claim 1, further comprising a gas source containing an inactive gas, the gas source being in fluid communication with both the first plurality of precursor source vessels and the reaction space.

6. The apparatus of claim 1, further comprising a second plurality of precursor source vessels in fluid communication with the reaction space, each vessel of the second plurality of precursor source vessels containing a same second source chemical.

7. The apparatus of claim 6, wherein the controller is configured to cause delivery of pulses of gas containing the second source chemical from at least two of the second plurality of precursor source vessels to the reaction space.

8. The apparatus of claim 7, wherein the controller is configured so that said pulses of gas from the second plurality of precursor source vessels have a substantially consistent concentration of the second source chemical.

9. An apparatus for vapor deposition, comprising:
a reaction space configured to receive a substrate;
a first plurality of precursor source vessels in fluid communication with the reaction space, wherein a first vessel of the first plurality of precursor source vessels contains a first source chemical and is configured to vaporize the first source chemical, and a second vessel of the first plurality of precursor source vessels contains the same first source chemical and is configured to vaporize the first source chemical wherein the first source chemical comprises at least one of a liquid and solid; and
a controller configured to cause delivery of pulses of gas containing the first source chemical from at least two of the first plurality of precursor source vessels to the reaction space, wherein the controller is configured to alternately supply the pulses of gas containing the first source chemical from the at least two of the first plurality of precursor source vessels during a deposition on the substrate, wherein the pulses include at least a first pulse and a second pulse from the first vessel of the first plurality of precursor source vessels, and an intervening pulse from the second vessel of the first plurality of precursor source vessels after the first pulse and before the second pulse, wherein the controller is configured to cause delivery of said pulses for pulse durations in a range between about 0.1 and 10 seconds;

wherein the first plurality of precursor source vessels and controller are configured to form at least a portion of a single film on the substrate from the first source chemical with the first pulse, second pulse, and intervening pulse.

* * * * *